United States Patent
Avis

[19]

[11] Patent Number: 5,850,104
[45] Date of Patent: Dec. 15, 1998

[54] INTEGRAL LID/CLAMP FOR HIGH POWER TRANSISTOR

[75] Inventor: Steven E. Avis, Pleasanton, Calif.

[73] Assignee: Spectrian, Inc., Sunnyvale, Calif.

[21] Appl. No.: 779,816

[22] Filed: Jan. 6, 1997

[51] Int. Cl.$^6$ .......................... H01L 23/02; H01L 23/12; H05K 7/20
[52] U.S. Cl. .................. 257/726; 257/719; 257/727; 257/732; 257/731; 257/704; 257/718
[58] Field of Search ................... 257/732, 712, 257/727, 730, 731–733, 704, 706, 707, 717, 718, 719, 720, 675

[56] References Cited

U.S. PATENT DOCUMENTS

| | | | |
|---|---|---|---|
| 3,287,604 | 11/1966 | Mroz et al. | 257/732 |
| 4,069,497 | 1/1978 | Stedlitz | 257/727 |
| 4,103,321 | 7/1978 | Gansert et al. | 257/732 |
| 4,110,549 | 8/1978 | Goetzke et al. | 257/732 |
| 4,259,685 | 3/1981 | Romano | 257/732 |
| 4,342,068 | 7/1982 | Kling | 257/732 |
| 4,517,585 | 5/1985 | Ridout et al. | 257/732 |
| 4,823,234 | 4/1989 | Konishi et al. | 257/697 |
| 5,126,827 | 6/1992 | Frank | 257/704 |
| 5,251,098 | 10/1993 | Schmidt | 257/718 |
| 5,283,467 | 2/1994 | Goeschel et al. | 257/718 |
| 5,291,063 | 3/1994 | Adishian | 257/732 |
| 5,392,193 | 2/1995 | Robertson, Jr. et al. | 361/704 |
| 5,428,188 | 6/1995 | Dozier | 257/692 |
| 5,428,504 | 6/1995 | Bhatla | 257/720 |
| 5,434,449 | 7/1995 | Himeno et al. | 257/690 |
| 5,592,021 | 1/1997 | Meschter et al. | 257/727 |
| 5,648,893 | 7/1997 | Loo et al. | 257/727 |
| 5,662,163 | 9/1997 | Mira | 257/719 |
| 5,770,891 | 6/1998 | Frankeny et al. | 257/727 |

FOREIGN PATENT DOCUMENTS

| | | | |
|---|---|---|---|
| 54-43676 | 4/1979 | Japan | 257/718 |
| 4-116853 | 4/1992 | Japan | 257/704 |

*Primary Examiner*—Tom Thomas
*Assistant Examiner*—Alexander Oscar Williams
*Attorney, Agent, or Firm*—Townsend and Townsend and Crew LLP; Henry K. Woodward

[57] ABSTRACT

An integral semiconductor package and mounting structure in which a lid for sealing a semiconductor chip on a platform includes flanges extending beyond the platform with the flanges having holes for receiving screws for mounting the package to a heat sink. The flanges are flexed into engagement with a heat sink thereby maintaining the package in yieldable pressure engagement with the heat sink.

11 Claims, 2 Drawing Sheets

INTEGRAL LID/CLAMP FOR HIGH POWER TRANSISTOR

BACKGROUND OF THE INVENTION

This invention relates generally to the packaging and mounting of semiconductor devices in electronic circuits, and more particularly the invention relates to the packaging and mounting of high power transistors which require heat sinks during operation.

RF power transistors are typically mounted on a ceramic platform which also supports a lead frame extending from the platform. The lead frame is interconnected with the transistor elements (e.g., emitter, base and collector for a bipolar transistor and source, gate, and drain for a field effect transistor) by wire bonding or by solder bumps which directly engage both the lead frame and transistor element contacts. The resulting structure, or pill, is then sealed by a lid to form the packaged transistor. The packaged transistor must be firmly mounted to a heat sink with heat from the semiconductor transistor being conducted through the ceramic platform to the heat sink.

Heretofore, a separate clamp has been employed for clamping the packaged transistor to the heat sink. However, this can result in uneven clamping force, cracking the lid or body, and ultimately transistor failure. Other prior art mounting includes soldering the ceramic platform directly to the heat sink, which introduces new failure mechanisms and increased thermal path resistance.

SUMMARY OF THE INVENTION

In accordance with the invention, an integral semiconductor package and mounting structure is provided which is economical to manufacture and enhances the mounting of a high power device to a heat sink.

More particularly, the lid for a transistor pill is provided with flanges extending from the periphery of the ceramic body, the flanges receiving fasteners for engaging and mounting the device to a heat sink. Preferably, the bottom surfaces of the flanges are slightly offset from the bottom surface of the pill whereby the flange flexes when tightened into engagement with the heat sink on which the pill is mounted. This requires that the lid be formed of a suitable resilient material, such as a plastic or polymer or other dielectric material, for example, with the deformation of the flanges creating a pressure engagement of the pill and heat sink. Moreover, the resilience of the flange material limits the stress on the pill and prevents fracture thereof.

The invention and objects and features thereof will be more readily apparent from the following detailed description and dependent claims taken with the drawing.

DETAILED DESCRIPTION OF THE ILLUSTRATIVE EMBODIMENTS

Figure 1:
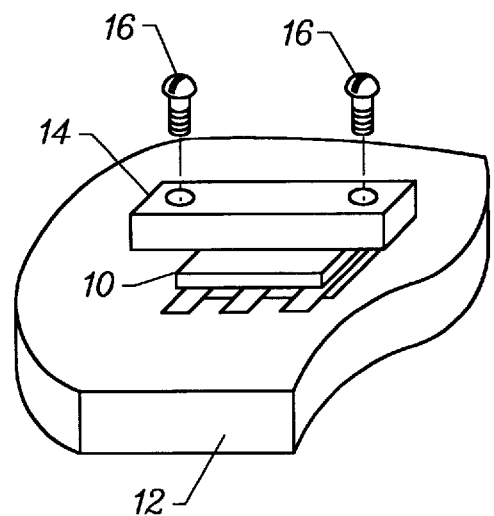
FIG. 1 is a perspective view of a packaged transistor mounted on a heat sink by a separate clamp in accordance with the prior art.

Referring now to the drawings, FIG. 1 is a perspective view of a packaged transistor 10 mounted to a heat sink 12 by a separate clamp 14 which maintains the packaged transistor 10 in pressure engagement with the heat sink by means of screws 16. As noted above, use of a separate mounting clamp can result in uneven clamping force leading to the cracking of the semiconductor package lid or body. Further, the clamp metal bar adds to the number of pieces required in mounting the device and thus increases the cost in manufacture and assembly.

Figure 2:
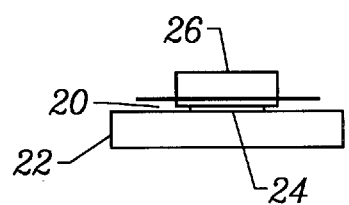
FIG. 2 is a perspective view of a packaged transistor with ceramic pill brazed or soldered directly to a metal flange that is then attached to a heat sink in accordance with the prior art.

FIG. 2 is a side view illustrating the mounting of the ceramic pill 20 directly to a metal flange 22 by means of solder or braze material 24. The flange is then attached to the heat sink such as by screws. However, the thermal path resistance between the package flange and the heat sink is increased and the cost of the flat plated flange is added.

Figure 3:
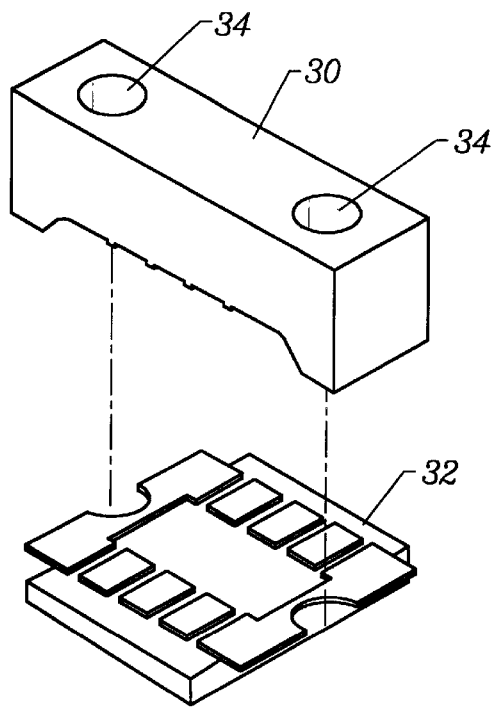
FIG. 3 is an exploded perspective view of the packaged transistor structure in accordance with one embodiment of the invention.

FIG. 3 is an exploded perspective view of a packaged transistor in accordance with one embodiment of the present invention in which the lid 30 for the transistor pill or platform 32 has extending flanges with holes 34 therein, whereby the lid also functions as a clamp for maintaining the packaged semiconductor transistor on a heat sink.

Figure 4:
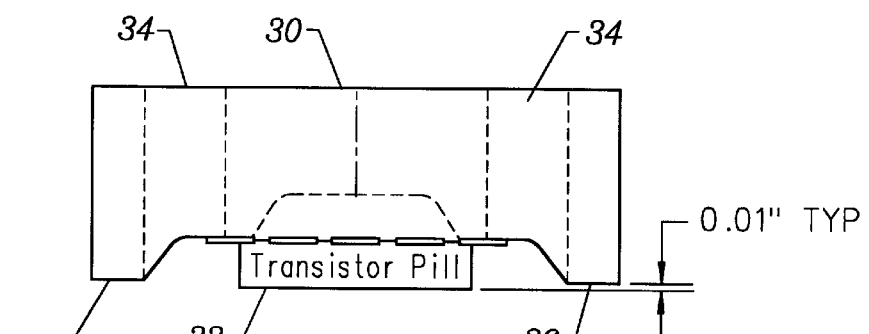
FIG. 4 is a side view in section of the packaged transistor of FIG. 3.
Figure 5:
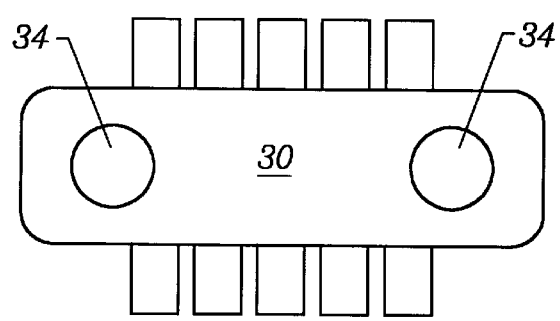
FIG. 5 is a top view of the packaged transistor of FIG. 3.

FIG. 4 is a side view and FIG. 5 is a top view of the packaged power transistor of FIG. 3. It will be noted that the flanges with holes 34 therethrough extend downwardly with surfaces 36 offset less than the thickness of the pill from the bottom surface of the transistor pill 32 which abuts the heat sink. Accordingly, lid 30 can be tightened into pressure engagement with the heat sink with the surfaces 36 engaging the heat sink surface along with the bottom surface 32 of the transistor pill, thereby maintaining the transistor device in a yieldable pressure engagement with the heat sink.

The amount of pressure exerted on the packaged device when mounted on the heat sink depends upon the material selected for the cover, which must be resilient in flexing into engagement with the heat sink. One such material is a plastic such as polyphenylene sulfide which is available under the trade name Ryton™. Other plastic or polymer based material can be used, including for example polyethyl pereth thalate (Rynite™), Ultem™, and vinyl ester. The material can include a metal stiffener embedded in the material.

By utilizing the transistor package lid as a clamp in accordance with the invention, manufacturing and assembly costs of the semiconductor package are reduced. Further, a desired pressure engagement of the semiconductor device with a heat sink is readily established by lid material selection and the spacing of flange surfaces from the heat sink before attachment.

While the invention has been described with reference to a specific embodiment, the description is illustrative of the invention and is not to be construed as limiting the invention. For example, clip fasteners can be employed in attaching the lid to a heat sink. Further, the lid can comprise a metal top portion and a dielectric bottom portion which engages the device. Thus, various modifications and applications may occur to those skilled in the art without departing from the true spirit and scope of the invention as defined by the appended claims.

What is claimed is:

1. A power semiconductor device package comprising
   a semiconductor chip in which a semiconductor device is formed, a platform on which said semiconductor chip is mounted, a plurality of leads electrically contacting said chip and extending from said platform, and a lid for engaging said platform and sealing said chip, said lid having a plurality of flanges extending beyond said platform and having holes for receiving fasteners for use in mounting the package to a heat sink.

2. The power device package as defined by claim 1 wherein said platform has a bottom surface for engaging a heat sink, said flanges having flange surfaces generally in parallel with said bottom surface and offset therefrom whereby said flange surfaces are spaced from a heat sink surface prior to fastening said package to a heat sink.

3. The power device package as defined by claim 2 wherein said flange surfaces flex into engagement with a heat sink upon tightening of fasteners extending through said holes into said heat sink.

4. The power device package as defined by claim 3 wherein said fasteners comprise screws which threadably engage holes in the heat sink.

5. The power device package as defined by claim 3 wherein said lid is formed from a resilient material.

6. The power device package as defined by claim 5 wherein said resilient material is a polymer.

7. The power device package as defined by claim 6 wherein said polymer comprises polyphenylene sulfide.

8. The power device package as defined by claim 1 wherein said lid is formed from a resilient material.

9. The power device package as defined by claim 8 wherein said resilient material is a polymer.

10. The power device package as defined by claim 9 wherein said polymer comprises polyphenylene sulfide.

11. The power device package as defined by claim 1 wherein said device comprises a transistor.

\* \* \* \* \*